United States Patent [19]
Wood et al.

[11] Patent Number: 5,912,850
[45] Date of Patent: *Jun. 15, 1999

[54] MULTI-PORT RAM WITH SHADOW WRITE TEST ENHANCEMENT

[75] Inventors: Steven William Wood, Kanata; Garnet Frederick Randall Gibson, Nepean, both of Canada

[73] Assignee: Northern Telecom Limited, Montreal, Canada

[ * ] Notice: This patent is subject to a terminal disclaimer.

[21] Appl. No.: 08/899,794

[22] Filed: Jul. 24, 1997

Related U.S. Application Data

[63] Continuation of application No. 08/667,828, Jun. 20, 1996, abandoned
[60] Provisional application No. 60/001,855, Aug. 3, 1995.
[51] Int. Cl.[6] .................................................. G11C 29/00
[52] U.S. Cl. .................... 365/201; 365/230.05; 365/190; 371/21.2
[58] Field of Search .............................. 365/201, 230.05, 365/190; 371/21.2

[56] References Cited

U.S. PATENT DOCUMENTS 5,561,638 10/1996 Gibson et al. ...................... 365/230.05
5,742,557 4/1998 Gibbins et al. ..................... 365/230.05

OTHER PUBLICATIONS

"A 5 Gb/s 9–Port Application Specific SRAM with Built–In Self Test", Wood, S., et al, IEEE, Aug. 1995 (0–8186–7102–5/95), pp. 68–73.

"Soft–Defect Detection (SDD) Technique for a High–Reliabilty CMOS SRAM", Kuo, C., et al, IEEE Journal of Solid–State Circuits, vol. 25, No. 1, Feb. 1990, pp. 61–67.

Primary Examiner—Andrew Q. Tran
Attorney, Agent, or Firm—Angela C. de Wilton

[57] ABSTRACT

A multi-port RAM (random access memory) includes RAM cells which are coupled to respective row and column lines of each port. RAM cells selected by signals on the row and column lines of a port store binary data. A ground level voltage is applied onto selected column lines in a shadow write mode. Any short between the active column lines and the column lines in shadow write will result in a significant error voltage being applied to the active column line and invalid read will result. Shorts between column lines from different ports are sensitized.

11 Claims, 6 Drawing Sheets

MULTI-PORT RAM WITH SHADOW WRITE TEST ENHANCEMENT

CROSS REFERENCE

This is a continuation of patent application Ser. No. 08/667,828, filed on Jun. 20, 1996 in the names of Steven WOOD et al. and entitled "Multi-Port RAM With Shadow Write Test Enhancement", now abandoned, with a priority claim from a Provisional Application of Ser. No. 60/001,855 filed on Aug. 3, 1995. The entire disclosure of patent application Ser. No. 08/667,828 is hereby incorporated herein by reference.

TECHNICAL FIELD

The present invention relates to a multi-port RAM (random access memory) with shadow write test enhancement feature.

BACKGROUND ART

Well known are RAMs which have at least one address port and include storage elements (core cells). In a paper by A. L. Silburt et al entitled "A 180-MHz 0.8-$\mu$m BiCMOS Modular Memory Family of DRAM and Multiport SRAM", IEEE Journal of Solid-State Circuits, Vol. 28, No. 3, March 1993, p. 222, at 227 shows various arrays of RAM storage elements.

In a paper by B. Nadeau-Dostie et al entitled "Serial Interfacing for Embedded-Memory Testing", IEEE Design & Test of Computers, April 1990, p. 52 discloses BIST architecture and memory test.

In RAMs, the problem is to develop a practical, non-intrusive method for sensitizing shorts between bit lines from different ports.

SUMMARY OF THE INVENTION

It is an object of the present invention to provide an improved multi-port RAM (random access memory).

In accordance with one aspect of the present invention, there is provided a multi-port RAM (random access memory) comprising: RAM cells of m rows by n columns, each RAM cell including storage means for storing binary data, the RAM cells being coupled to respective row and column lines of each port, m and n being integers; data write means for storing binary data in the RAM cells selected by signals on the row and column lines of a port; data read means for reading the binary data stored in the RAM cells selected by signals on the row and column lines of a port; and voltage driving means for applying a predetermined level voltage onto selected ones of the column lines in a shadow write mode.

In an example, the voltage driving means comprises means for driving the predetermined level voltage onto all column lines or selected column lines of at least one selected port in the shadow write mode. The predetermined level voltage is the ground level voltage. For example, in a case of read ports, active column lines are at a precharge level and column lines of other ports are driven to the ground level voltage in the shadow write mode. Any short between the active column lines and the column lines in shadow write will result in a significant error voltage being applied to the active column line and invalid read will result. Shorts between column lines from different ports are sensitized.

BRIEF DESCRIPTION OF THE DRAWINGS

An embodiment of the present invention will now be described by way of example with reference to the accompanying drawings in which.

DETAILED DESCRIPTION

I. 9-Port Memory Architecture

Figure 1:
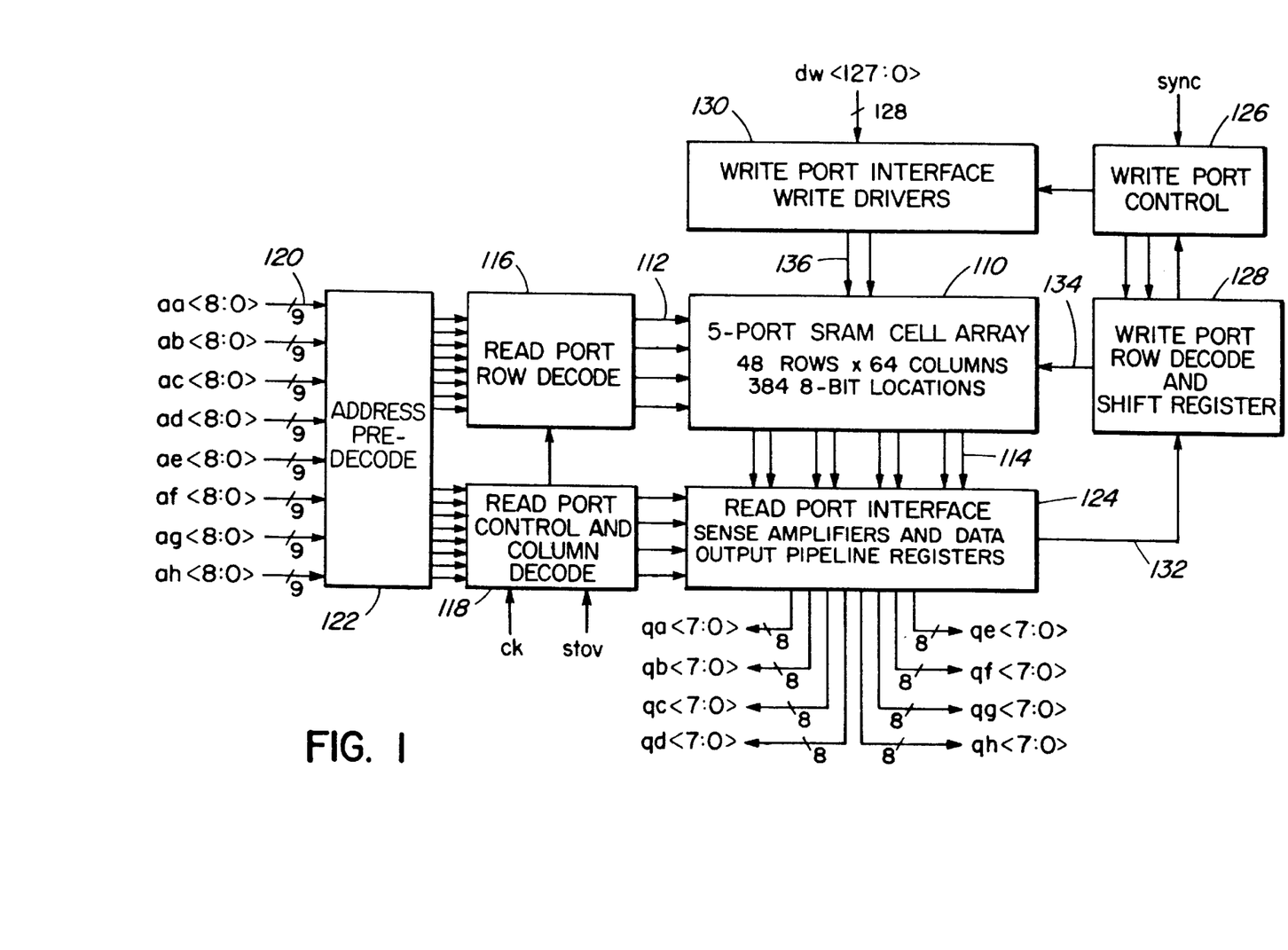
FIG. 1 is a block diagram of a multi-port RAM (random access memory)

FIG. 1 shows a multi-port RAM. The 9-port SRAM (static random access memory), is configured as 384 bytes of memory storage with a single 24×128-bit (16 byte) write port and eight 384×8-bit read ports. It is implemented as a 48 row by 64 column core cell array. The 128-bit write is row interleaved with 64-bits written to each of two selected rows per write cycle to give a more optimum array aspect ratio.

A 5-port RAM cell with four fully-differential read ports and a single-ended pseudo-differential write port has been designed. Differential read ports are selected for enhanced performance relative to a more compact single-ended architecture. An indirect read-access architecture is used to eliminate multiport cell stability problems associated with multiple simultaneous accesses to a cell. The single-ended write scheme combined with row interleaving saves two write bit lines per column. A local bit line inversion scheme is used to provide a pseudo-differential write capability at the core-cell for equivalent-to-differential write performance.

The multi-port RAM has a 5-port SRAM cell array 110 with one write port and four read ports. The SRAM cell array 110 is connected to read word lines 112 and read bit lines 114. The SRAM cell array 110 has RAM cells of m (=48) rows and n (=64) columns. The address identifying the RAM cell for data reading in the SRAM cell array 110 is defined by X- and Y-address signals which are provided by means for selecting RAM cells for reading binary data, i.e., a read port row decoder 116 and a read port control and column decoder 118, respectively. The address data is contained in an address signal which is present on an input bus 120, the address signal having X- and Y-address data. The address data is fed to an address predecoder 122 which provides the X- and Y-address data to the read port row decoder 116 and the read port control and column decoder 118, respectively. A data output circuit 124 is connected to the SRAM cell array 110 for data read. The multi-port RAM includes means for selecting RAM cells for storing binary data, i.e., a write port control circuit 126, a write port row decoder and shift register 128 and a write port interface circuit 130. The write port row decoder and shift register 128 is connected to the data output circuit 124 through a write clock line 132. The write port row decoder and shift register 128 and write port interface circuit 130 are connected to the 5-port SRAM cell array 110 through write word lines 134 and write bit lines 136, respectively. A data write function is performed by the write port control circuit 126, the write port row decoder and shift register 128 and the write port interface circuit 130.

The 9-port operation is obtained by time multiplexing the four physical read ports in the core array. Two full read accesses to the core are performed on these ports in each clock cycle. The read data is then re-timed and latched into eight output ports for presentation to the user on the rising edge of the system clock. All read port inputs are provided to the 9-port interface at the same rising clock edge and are internally pipelined to perform the read access. Read operation is controlled by a self-timed clock generator that shuts down each read cycle as fast as possible following data access to minimize power. The self-timed operation provides nearly constant power dissipation across all process cases. The entire multiplexed read operation is initiated by a single rising edge of the system clock, simplifying the top-level interface and minimizing clock duty-cycle requirements. See U.S. Pat. No. 5,612,923 entitled "Multi-Port Random Access Memory" granted to the same inventors on Mar. 18, 1997, which claims priority from U.S. provisional Application No. 60/001,856 filed on Aug. 3, 1995, which is incorporated herein by reference.

The read memory map is customized to provide two independent data pages which can be switched with a single-bit toggle. The write port data is mapped physically, via data register placement, to match the read data map. No column decoding is required in the write-port. Since the TSI application requires sequential write addressing, a built-in write address counter is provided along with page synchronization controls to detect page switch events.

In addition, the memories are provided with an ultra-low power "no-power" mode by internally gating all interface signals, including the clock, with a power-down signal, eliminating any signal transitions within the memory while power-down is asserted.

In order to facilitate scan and BIST design methodologies, the memory interface includes built-in scan chains for address and data signals plus a special multiport test mode called shadow write. The scan chains are independently controllable, so that multi-segment chains can be supported.

The shadow write mode is provided for inter-port short detection [B. Nadeau-Dostie et al entitled "Serial Interfacing for Embedded-Memory Testing", IEEE Design & Test of Computers, April 1990, p. 52], which is incorporated herein by reference, by assertion of a combination of test mode control signals.

Figure 2:
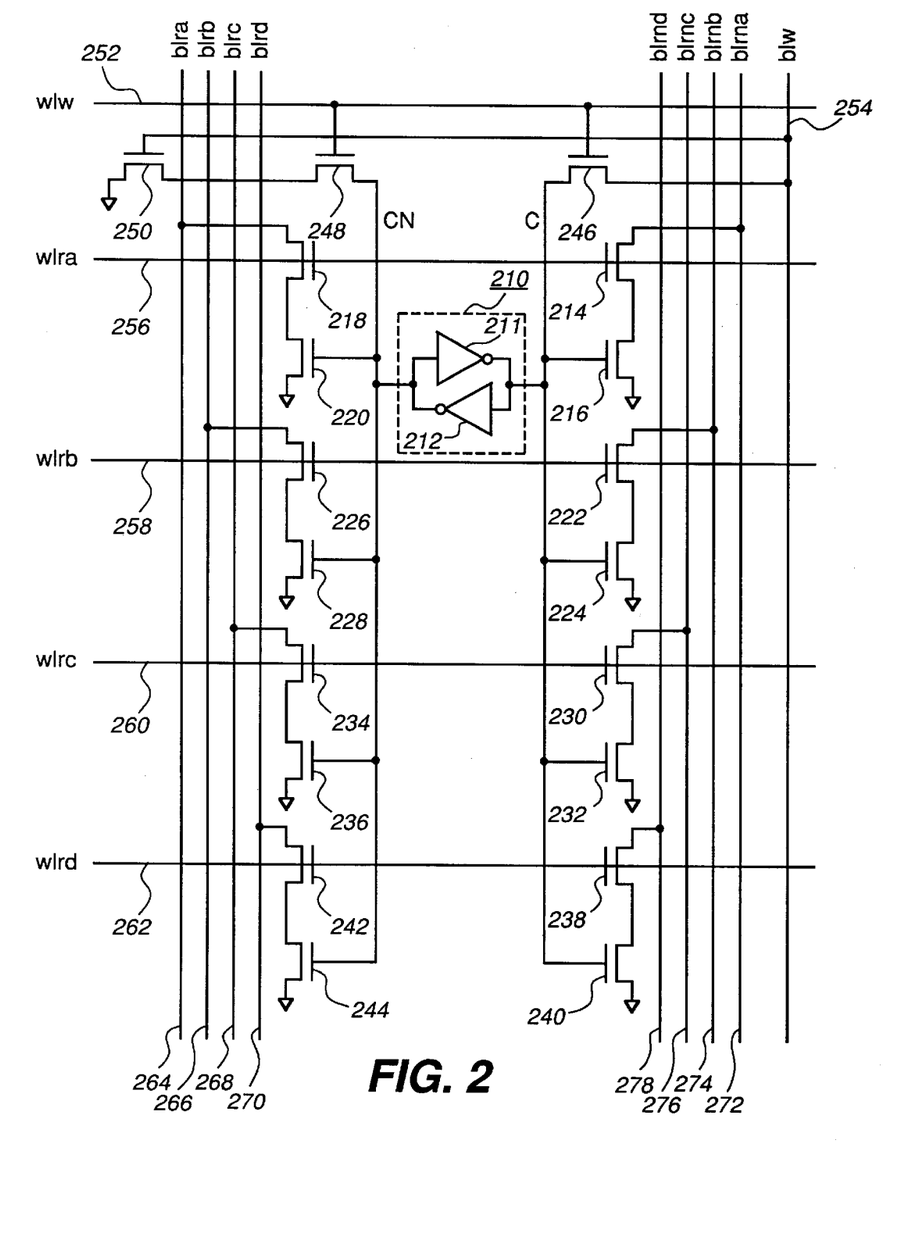
FIG. 2 is a circuit diagram of an SRAM (static random access memory) cell included in the RAM shown in FIG. 1.

The RAM cell of the multi-port SRAM core array shown in FIG. 2 consists of four differential read ports with indirect data access via gated, bit line pull-down transistors and one single-ended write-only port with local bit line inversion to give pseudo-differential write access.

The RAM cell shown in FIG. 2 has a five-port storage element and includes one write port and four differential read ports with indirect data access. The RAM cell has a latch 210 which includes two inverters 211 and 212. Each of the inverters 211 and 212 has a CMOS (complementary metal oxide semiconductor) inverter. The input and the output terminals of the inverter 211 are connected to the output and the input terminals of the inverter 212, respectively.

The source of a FET 214 is connected to the drain of a FET 216 and the source of a FET 218 is connected to the drain of a FET 220. Similarly, the source of a FET 222 is connected to the drain of a FET 224 and the source of a FET 226 is connected to the drain of a FET 228. The source of a FET 230 is connected to the drain of a FET 232 and the source of a FET 234 is connected to the drain of a FET 236. The source of a FET 238 is connected to the drain of a FET 240 and the source of a FET 242 is connected to the drain of a FET 244.

The output terminal of the inverter 211 and the input terminal of the inverter 212 are connected to the gates of the FETs 216, 224, 232 and 240 and the drain of a FET 246. The input terminal of the inverter 211 and the output terminal of the inverter 212 are connected to the gates of the FETs 220, 228, 236 and 244 and the drain of a FET 248 whose source is connected to the drain of a FET 250. The sources of the FETs 216, 220, 224, 228, 232, 236, 240, 244 and 250 are connected to the ground terminal.

The gates of the FETs 246 and 248 are connected to a line 252 on which a write word line signal wlw is present. The gate of the FET 250 and the source of the FET 246 are connected to a line 254 on which a write bit line signal blw representing data "zero" or "one" is present.

A line 256 on which a word line read signal wlra is present is connected to the gates of the FETs 214 and 218. A line 258 on which a word line read signal wlrb is present is connected to the gates of the FETs 222 and 226. A line 260 on which a word line read signal wlrc is present is connected to the gates of the FETs 230 and 234. A line 262 on which a word line read signal wlrd is present is connected to the gates of the FETs 238 and 242.

The drains of the FETs 218, 226, 234 and 242 are connected to bit lines 264, 266, 268 and 270, respectively, on which read bit line signals blra, blrb, blrc and blrd are present. The drains of the FETs 214, 222, 230 and 238 are connected to bit lines 272, 274, 276 and 278, respectively, on which read bit line signals blrna, blrnb, blrnc and blrnd are present. The bit lines 264 and 272, 266 and 274, 268 and 276, 270 and 278 are pairs of bit lines and on the respective pairs, the read bit line signals blra and blrna, blrb and blrnb, blrc and blrnc, and blrd and blrnd are which are differential signals are present.

Figure 3:
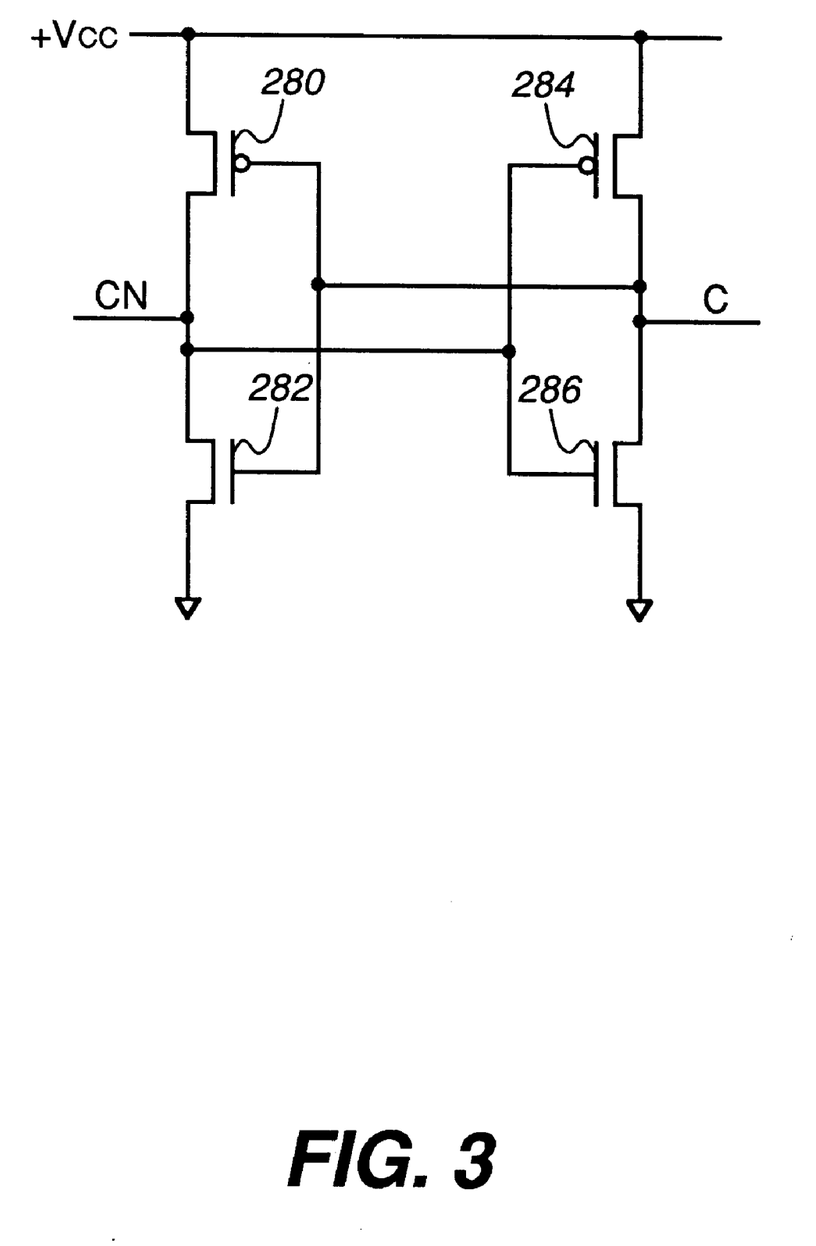
FIG. 3 is a detailed diagram of a latch shown in FIG. 2.

FIG. 3 shows a detail of the latch 210 of the multi-port RAM core array. The latch 210 is a well known RAM storage element which includes two CMOS inverters. In FIG. 3, the drains of a P-channel FET 280 (a load device) and a FET 282 (a drive device), which define one CMOS inverter, are connected to the gates of a P-channel FET 284 (a load device) and a FET 286 (a drive device), which define the other CMOS inverter. Similarly, the drains of the FETs 284 and 286 are connected to the gates of the FETs 280 and 282. The sources of the FETs 280 and 284 are connected to the voltage terminal of the supply voltage +Vcc. The sources of the FETs 282 and 286 are connected to the ground terminal. The junction of the drains of the FETs 280 and 282 defines node CN. The junction of the drains of the FETs 284 and 286 defines node C. Nodes CN and C are data input and output terminals of the latch 210.

Structure and operation of the multi-port SRAM core array are described in detail in U.S. Pat. No. 5,561,638 entitled "Multi-Port SRAM Core Array" granted to the same inventors on Oct. 1, 1996, which claims priority from U.S. provisional Application No. 60/001,578 filed on Jul. 27, 1995, which is incorporated herein by reference.

Figure 4:
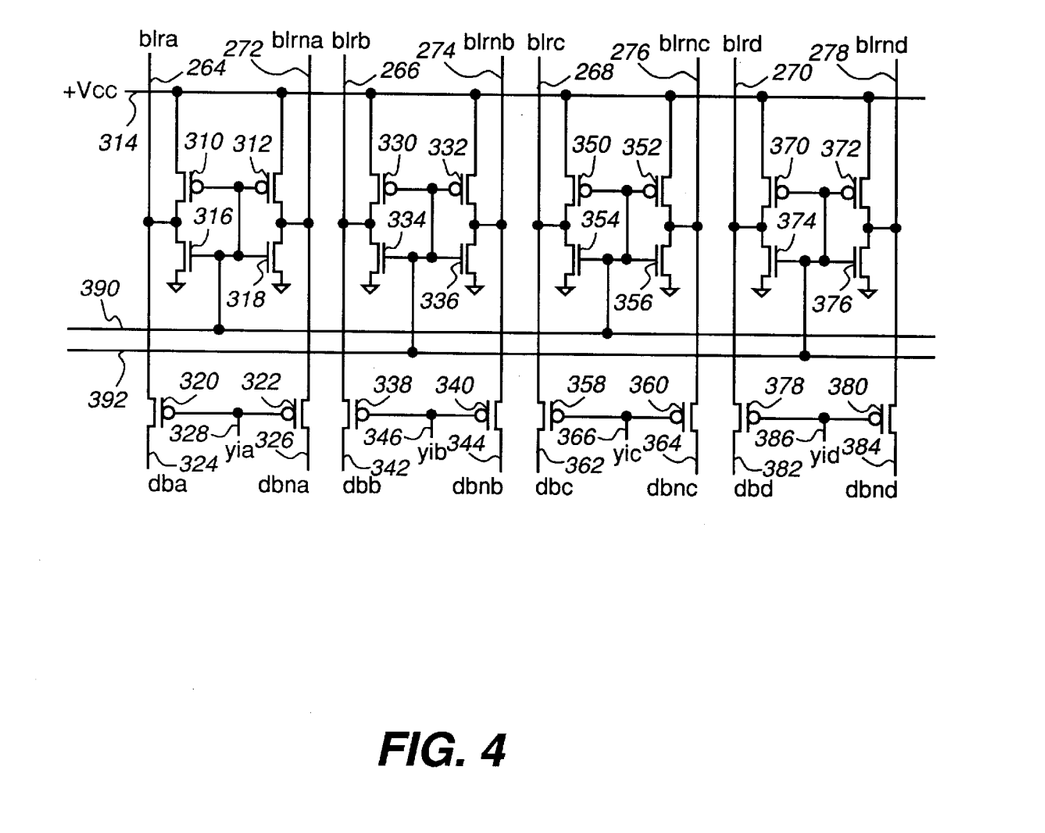
FIG. 4 is a diagram of circuitry for providing the memory column access and bit line clamp with shadow write.

FIG. 4 shows circuitry for providing the memory column access and bit line clamp with shadow write. The circuitry includes first to fourth circuits for first to fourth ports a–d, each circuit having four P-channel MOSFETs and two N-channel MOSFETs. In the first circuit for column a, the sources of FETs 310 and 312 are connected to a voltage supply terminal 314 of a positive voltage +Vcc. The sources of FETs 316 and 318 are connected to the ground terminal. The drains of the FETs 310 and 316 are connected to the drain of the FET 320. The drains of the FETs 312 and 318 are connected to the drain of a FET 322. A pair of bit lines 264 and 272 (blra and blrna) are connected to the drains of the FETs 320 and 322, respectively. The sources of the FETs 320 and 322 are connected to a pair of read data lines 324 and 326 (dba and dbna). The gates of the FETs 320 and 322 are connected to a column access signal line 328 (yia).

Similarly, in the second circuit for column b, the sources of FETs 330 and 332 are connected to the voltage supply terminal 314. The sources of FETs 334 and 336 are connected to the ground terminal. The drains of the FETs 330 and 334 are connected to the drain of a FET 338. The drains of the FETs 332 and 336 are connected to the drain of a FET 340. A pair of bit lines 266 and 274 (blrb and blrnb) are connected to the drains of the FETs 338 and 340, respectively. The sources of the FETs 338 and 340 are connected to a pair of read data lines 342 and 344 (dbb and dbnb). The gates of the FETs 338 and 340 are connected to a column access signal line 346 (yib). Also, the third and fourth circuits for columns c and d are similar to the first circuits.

In this example, there are two shadow write lines 390 and 392. The gates of the FETs 310, 312, 316 and 318 of the first circuit and the gates of the FETs 350, 352, 354 and 356 of the third circuit are connected to the shadow write line 390 on which a shadow write a/c signal is present. The gates of the FETs 330, 332, 334 and 336 of the second circuit and the gates of the FETs 370, 372, 374 and 376 of the fourth circuit are connected to the shadow write line 392 on which another shadow write b/d signal is present.

The pairs of the two read-port bit lines 264, 272 (blra, blrna) and 268, 276 (blrc, blrnc) can be driven to the ground potential, while test patterns are run on the other pair of the two bit lines 266, 274 (blrb, blrnb) and 270, 278 (blrd, blrnd) to detect read errors. Similarly, the pairs of the two read-port bit lines 266, 274 (blrb, blrnb) and 270, 278 can be driven to the ground potential, while test patterns are run on the other pair of the two bit lines 264, 272 and 268, 276 to detect read errors. This mode is implemented with no critical path overhead by specific control of the bit line clamp devices; i.e., FETs 310, 312; 330, 332; 350, 352; and 370, 372.

Detection of shorts due to manufacturing defects between bit lines from different ports which run parallel to each other over large distances (the "height" of the memory array) is difficult due to the small differential signal swing used in a high-speed read-only memory port architectures. Such faults may pass undetected during manufacturing test and result in intermittent failures in the field. A shadow write methodology may be used to sensitize the port-to-port bit line short failures during BIST or functional testing.

Shadow Write for Multi-Port Read-Only Architectures is used to sensitize the bit line short faults while running standard test patterns on two ports while the bit lines from the other ports are driven to the vss potential (0 volts) by the shadow write circuitry. Since the active bit line precharge level is approximately vdd potential (3.3 volts), any short between an active bit line and a bit line in shadow write (at 0 volts) will result in a significant error voltage being applied to the active bit line and an invalid read will result.

In normal read mode, the FETs 310 and 312 are on to limit the voltage swing on the bit lines (blra and blrna) to less than 500 mV. When shadow write mode is enabled two read-port bit line pairs are driven to the vss potential by the FETs 316 and 318 and the FETs 354 and 356 (or the FETs 334 and 336 and the FETs 374 and 376) while test patterns are run on the other two bit line pairs to detect read errors. The shadow write a/c signal on the shadow write line 390 and the shadow write b/d signal on the shadow write line 392 select the columns on which shadow write is to be enabled.

In this example, two shadow write control signals are added to the memory control; one to enable shadow write mode and the other to select between the shadow write a/c and shadow write b/d signals. No other circuitry is required.

The latch 210 stores data "zero" or "one". When the word line read signal wlra on the line 256 is "high", the FETs 218 and 214 are gated. In a case of the "zero" data, the FETs 220 and 218 become on and the bit line 264 is pulled-down by the on FETs 220 and 218, with the result that the read bit line signal blra becomes "low". The FETs 216 and 214 are off and the read bit line signal blrna on the line 272 is "high". Hence, data "zero" is read.

In a case of the "one" data, the FETs 216 and 214 become on and the bit line 272 is pulled-down by the on FETs 216 and 214, with the result that the read bit line signal blrna becomes "low". The FETs 220 and 218 are off and the read bit line signal blra on the line 264 is "high". Hence, data "one" is read.

When the shadow write a/c signal on the shadow write line 390 is "low" and the shadow write b/d signal on the shadow write line 392 is "high", the FETs 334 and 336 of the second circuit and the FETs 374 and 376 of the fourth circuit are on and the pairs of the two read-port bit lines 266, 274 (blrb, blrnb) and 270, 278 (blrd, blrnd) are driven to the ground potential, via the on-FETs. Hence, the data read through the bit lines 266, 274 of port b and 270, 278 of port d is ceased. At the same time, the FETs 310 and 312 of the first circuit and the FETs 350 and 352 of the third circuit are on and the pairs of the two read-port bit lines 264, 272 (blra, blrna) and 268, 276 (blrc, blrnc) are enabled. Hence, test patterns are run on the pairs of the two bit lines 264, 272 and 268, 276 to detect read errors, while the other bit lines of ports b and d is prevented from being tested. The test patterns run on the bit line pair is read via the FETs 320, 322 and 358, 360 to the pair of read data lines 324, 326 (dba, dbna) and 362, 364 (dbc, dbnc), while the column access signal lines 328 (yia) and 366 (yic) are "low".

Similarly, when the shadow write a/c signal on the shadow write line 390 is "high" and the shadow write b/d signal on the shadow write line 392 is "low", the on-FETs 316 and 318 of the first circuit and the FETs 354 and 356 of the third circuit, the pairs of the two read-port bit lines 264, 272 (blra, blrna) and 268, 276 (blrc, blrnc) are driven to the ground potential. Test patterns are run on the pairs of the two bit lines 266, 274 and 270, 278 to detect read errors. The test patterns run on the bit line pair are read via the on-FETs 338, 340 and 378, 380 to the pair of read data lines 342, 344 (dbb, dbnb) and 382, 384 (dbd, dbnd), while the column access signal lines 346 (yib) and 386 (yid) are "low".

Performance of the 9-port TSI memory in a 0.8 $\mu$m BiCMOS technology is summarized in Table 1. The memory requires only the CMOS devices of the analog enhanced BiCMOS technology described in [A. L. Silburt et al entitled "A 180-MHz 0.8-$\mu$m BiCMOS Modular Memory Family of DRAM and Multiport SRAM", IEEE Journal of Solid-State Circuits, Vol. 28, No. 3, March 1993, p. 222–232], which is incorporated herein by reference; no bipolar, resistor or capacitor devices are required.

TABLE 1

| 9-Port TSI Memory Performance | | |
| --- | --- | --- |
| Cycle Time (tCHCH) | 4.5 | ns |
| Pipelined Access Time (tCHQV) | 3.2 | ns |
| Setup Time (tDVCH) | 1.7 | ns |
| Hold Time (tCHDX) | 0 | ns |
| Active Power | 5.0 | mW/MHz |

Test conditions: 3.3 V, 27° C., typical process

II. BIST Scheme

The objective of the 9-port memory BIST is to provide a high fault coverage test for the memory that can be utilized at different levels of system integration. The architecture of the memory mandates a custom self test scheme. The write port does not have random addressing capability, because of the sequential write operation. This makes the use of the serial interfacing technique and SMARCH algorithm [B. Nadeau-Dostie et al entitled "Serial Interfacing for Embedded-Memory Testing", IEEE Design & Test of Computers, April 1990, p. 52] ineffective for this architecture.

II-1 Fault Model

The objective of the TSI memory BIST is to comply with the system level test strategy by providing high-speed and complete self test capability of the memory and related interconnect, while minimizing the impact of the BIST interface on mission mode performance. The design of the BIST is based on the following considerations:

1. The BIST must detect stuck-open faults in the address decoder of the read only ports. Address transitions are required to sensitize these faults which can only be detected through read contention. The uncertainty of detection through read contention forces the use of at least two pairs of foreground/background patterns.

2. The memory has asymmetrical address space for uni-directional ports. All words are accessible from each port for read or write operations, but words are written 16 at a time to the write port and read one at a time from the eight read ports. The write port access is limited to the implemented sequential addressing scheme; a complete row pair of 16 bytes is selected by a shift register. This selection mechanism, although simpler to use than a normal decoder, can only be tested indirectly by reading from the other ports. Bidirectional read/write ports are not considered feasible for performance and complexity reasons.

3. The fault mechanisms for bit line shorts and word line shorts are described in [B. Nadeau-Dostie et al entitled "Serial Interfacing for Embedded-Memory Testing", IEEE Design & Test of Computers, April 1990, p. 52]. The shadow write mode is implemented to allow testing of two read ports while the bit lines of the other two read ports are driven to ground potential. Both bit line shorts and word line shorts are detected in this manner.

4. Shorts between bits of the same word are not possible due to the bit sliced architecture of the memory. Alternate foreground/background data patterns are used to cover potential shorts in the data paths.

II-2 The BIST Algorithm

The BIST algorithm is as follows:

```
/* initialize array */
for i = 0 to W-1
    Write 0
endfor
for i = 0 to W-1
    /* write FG / BG */
    for j = 0 to W-1
        if i ≠ j
            Write [j] = BG
        else
            Write [i] = FG
        endif
    endfor
    /* verify FG / BG */
    for j = 0 to W-1
        if i ≠ j
            Read [j] = BG
            Read [i] = FG
        else
            Read [j] = FG
            Read [i] = FG
        endif
    endfor
endfor
```

This algorithm is similar to Galpat [A. J. van de Goor, "Testing Semiconductor Memories Theory and Practice", John Wiley & Sons Ltd., Baffens Lane, Chichester, West Sussex, PO19 1UD, England, 1991], which is incorporated herein by reference, at least on the read ports. The algorithm is repeated with four different foreground/background (FG/BG) patterns; i.e., 00,FF,AA,55 (HEX). Where W represents the distinct number of locations for each read port (384). The foreground/background patterns are expressed in terms of bytes as read from the read ports.

The BIST write operation is similar to the normal (functional) write operation. All locations in the RAM are written in bursts with the write operation disabled once both pages of data have been written.

The approximate execution time (T) in clock cycles of the BIST algorithm is given by:

$$T = (2\ W^2 + 24\ W) \times 2 \times 4 = 2.4\ M\ cycles$$

where, the multiplication factor of 4 is used to account for the four different foreground/background patterns to be applied. The multiplication factor of 2 is introduced to account for the shadow write mode in which only half of the read ports are tested at one time.

A variation of the MARCH algorithm [B. Nadeau-Dostie et al entitled "Serial Interfacing for Embedded-Memory Testing", IEEE Design & Test of Computers, April 1990, p. 52] plus the DECSO algorithm [A. J. van de Goor, "Testing Semiconductor Memories: Theory and Practice", John Wiley & Sons Ltd., Baffens Lane, Chichester, West Sussex, PO19 1UD, England, 1991, pp. 362–369] to detect decoder stuck-open faults is almost as complex as this variation of the GALPAT algorithm.

II-3 The BIST Architecture

The BIST circuit is designed to capture the above algorithm and provide the necessary access to the test through the IEEE 1149.1 test access port (TAP) available on chip.

Figure 5:
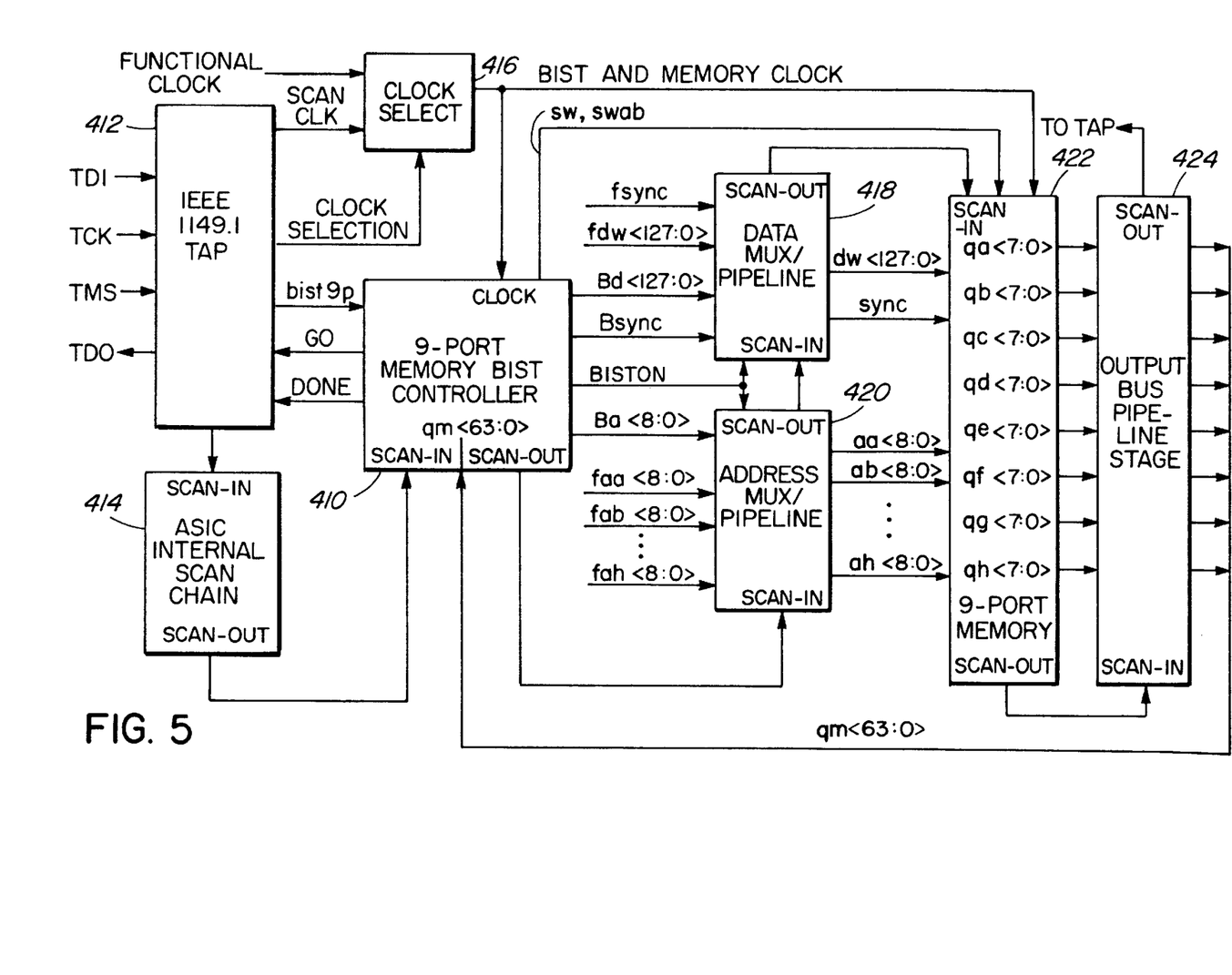
FIG. 5 is a block diagram of BIST (built-in self test) circuitry.

FIG. 5 is a diagram of BIST circuitry. In FIG. 5, a 9-port memory BIST controller 410 is connected to a TAP circuit 412, a chip scan chain 414, a clock selector 416, a data multiplexer 418, an address multiplexer 420, a 9-port memory 422 and an output circuit 424.

The number of wires between the BIST controller 410 and the datapath are kept low by limiting the number of data patterns used for the foreground/background. The functional input data bus of the 9-port memory 422 is multiplexed by the data multiplexer 418 under the control of the BIST controller 410. The read addresses for all eight ports of the 9-port memory 422 are also multiplexed by the address multiplexer 420 under the control of the BIST controller 410. The output read data ports are monitored by the BIST controller 410 and compared with the reference data. In both cases the functional pipeline stages are used for the BIST data and address paths. The functional pipeline stage of the output ports are also employed for the BIST data bus in the output circuit 424.

Performance testing of the 9-port memory 422 is achieved by using the functional clock for the BIST controller 410 as well as the 9-port memory 422. However, for diagnostics purposes, the BIST can also be run using the test clock or a slower functional clock provided by the clock selector 416.

The BIST is initiated by shifting a private instruction into the TAP circuit 412. This instruction forces the bist9p signal high. Upon receiving the start BIST instruction, the BIST controller 410 goes through an initialization phase and asserts the GO and de-asserts the DONE signals. The BIST controller 410 proceeds to apply the patterns described in the algorithm above and monitors the responses of the memory accordingly. Once an error is detected, the BIST controller 410 de-asserts the GO signal indicating a test failure. If no failure is detected after applying all patterns, the BIST controller 410 will assert the DONE signal. Both the GO and DONE signals are captured in the TAP and are shifted out for off-chip comparison.

The implementation of the BIST controller 410 is optimized to reduce area overhead and minimize BIST execution time. To reduce execution time, half of the ports are tested for the same address at any time. Furthermore, to decrease the routing area, all read ports are compared to the expected data in parallel with the compare signature shifted out serially.

Figure 6:
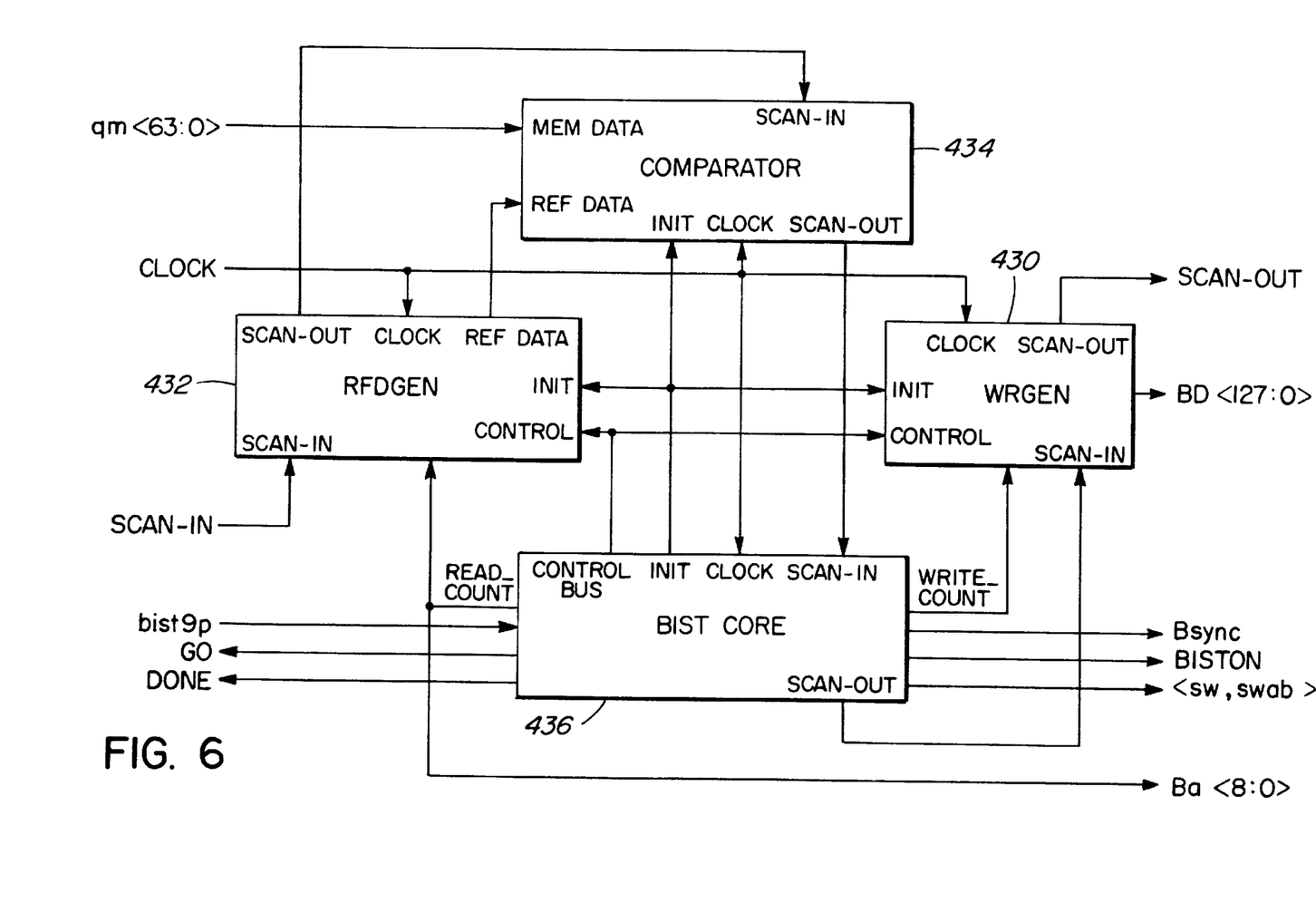
FIG. 6 is a block diagram of a BIST controller shown in FIG. 5.

FIG. 6 shows the 9-port BIST controller 410 which includes a write data generator (WRGEN) 430, a reference data generator (RFDGEN) 432, a 64-bit parallel comparator 434 and a BIST core circuit 436.

The write data generator 430 generates the foreground/background data needed to write to the 9-port memory 422. The 128-bit output bus is divided into 16 bytes. The BG data is injected onto the bus depending on the write cycle counter (from the BIST core circuit 436). This port is to be connected to the write data port of the 9-port memory 422.

The reference data generator 432 generates the expected data (one byte) for all ports. Depending on the read address (generated by the BIST core circuit 436), reference data is calculated and applied to the comparator 434 to be compared to the data read from the 9-port memory 422.

The comparator 434 is designed to compare the data read from the 9-port memory 422 to the reference data generated by the reference data generator 432. The comparator 434 is invoked only during the read cycle and only read ports under test are compared. The compare registers of the other ports hold their previous state. At the end of the read cycle, the contents of the comparator registers are shifted out (through the scan path chain) to the BIST core circuit 436 and monitored for errors. All zero value data in the compare registers are considered to be the correct signature; otherwise the previous write/read cycle has detected a fault in the 9-port memory 422. This procedure provides diagnostic information for the BIST that simplifies the process of fault location.

The BIST core circuit 436 controls the operation of the BIST. It consists of several counters, a signature monitor and a finite state machine. It is also responsible for communicating to the chip and providing the necessary signals to control the memory interface.

To accommodate the high speed test, the BIST controller 410 is designed and optimized for a 100 MHz clock rate. A minimum number of pipeline stages are added at selected places to minimize the area overhead.

A scan chain is inserted in the BIST controller 410 and is connected to the internal scan chain of the chip and 9-port memory scan interface. All pipeline stages are scan testable guaranteeing full testability of the BIST controller 410 and the memory interface.

The 5-port SRAM cell array 110 is designed with four fully-differential read ports and a single-ended write port. The 9-port operation is obtained by time multiplexing the four physical read ports in the core array. The 9-port memory 422 is designed with built-in features to support structural testing.

To facilitate product testing, a novel BIST architecture based on the Galpat algorithm is designed and implemented. The number of wires between the BIST controller 410 and the datapath is kept low by limiting the number of data patterns used for the foreground/background. The BIST circuit is designed to provide access to the self test function at all levels of system integration. Performance testing is achieved by running the BIST at the functional clock rate, however running the BIST at slower clock speed is also available as an option that can be used for diagnostic purposes.

This feature is scalable. Although it has been implemented for a memory with four physical read ports, there is no limitation for its use on any design with two or more read-only ports.

This feature is not limited to SRAM applications. It may be used on any differential read-only port architecture (including 4-transistor DRAMs) and adapted to read/write port architectures.

The architecture of a TSI SRAM for a SONET switching application and its associated BIST architecture are described. The memory port architecture of eight byte-wide, read-only ports and a single, 128-bit write-only port is designed to provide maximum data throughput with the minimum number of memories and to fit easily into the data flow at the ASIC level. To reduce the number of data RAMs required for full switching, the memory throughput is boosted by providing multiplexed access to the core at twice the system clock rate. Other mission-mode features such as self-contained, sequential write-address generation, application-specific address mapping, no-power mode, and page-synchronization controls provide system-level flexibility and simplified ASIC design. A synchronous memory interface with scan path collar and special test modes is provided to simplify scan application and design while enhancing multiport-BIST coverage. The nature of the memory requires a novel BIST architecture to ensure full test coverage.

Although particular embodiment of the present invention have been described in detail, it should be appreciated that numerous variations, modifications, and adaptations may be made without departing from the scope of the present invention as defined in the claims.

What is claimed is:

1. A multi-port RAM (random access memory) comprising:
   an array of RAM cells of m rows by n columns, m and n being integers, the RAM cells being coupled to respective row and column lines of each port;
   means for selecting RAM cells for storing binary data by applying signals on row and column lines;
   means for selecting RAM cells for reading binary data by applying signals on respective row and column lines; and
   test means comprising voltage driver for driving a predetermined level voltage onto selected column lines to cease data read in selected column lines in a test mode.

2. The multi-port RAM of claim 1, wherein the voltage driver comprises a plurality of switching devices, each being coupled with the respective column line and a voltage terminal to which the predetermined level voltage is fed.

3. The multi-port RAM of claim 2, wherein the switching device comprises a FET (field effect transistor), the drain-source of which is coupled between the respective column line and the voltage terminal, a control signal is applied to the gate of the FET.

4. The multi-port RAM of claim 3, further comprising means for providing a ground level voltage to the voltage terminal.

5. The multi-port RAM of claim 1, wherein the RAM cell comprises storage means for storing differential binary data.

6. The multi-port RAM of claim 5, wherein the column lines comprises differential bit lines, the storage means of the RAM cells of each column are coupled to the respective differential bit lines.

7. The multi-port RAM of claim 1, further comprising means for selecting a port.

8. A method for testing a multi-port RAM comprising an array of RAM cells of m rows by n columns, m and n being integers, the RAM cells being coupled to respective row and column lines of each port, the RAM cells storing binary data being selected by signals on the row and column lines, the binary data stored in the RAM cells selected by signals on the row and column lines being read, the method comprising the steps of:
   selecting column lines; and
   driving a predetermined level voltage onto the selected column lines to cease data read in the selected column lines in a test mode.

9. The method of claim 8, further comprising the step of running test patterns through non-selected column lines in the test mode.

10. The method of claim 8, wherein the step of driving comprises the step of driving a ground level voltage onto the selected column lines in the test mode.

11. The method of claim 8, further comprising the steps of:

driving a ground level voltage onto the selected column lines in the test mode, the selected column lines being adjacent to a non-selected column line, data read in the selected column lines being ceased; and running test patterns through the non-selected column lines in the test mode.

\* \* \* \* \*